(12) United States Patent
Burnett

(10) Patent No.: US 7,403,410 B2
(45) Date of Patent: Jul. 22, 2008

(54) SWITCH DEVICE AND METHOD

(75) Inventor: James D. Burnett, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/373,532

(22) Filed: Mar. 10, 2006

(65) Prior Publication Data

US 2007/0211526 A1  Sep. 13, 2007

(51) Int. Cl.
*G11C 11/00* (2006.01)

(52) U.S. Cl. .............. 365/154; 365/185.23; 365/230.06

(58) Field of Classification Search .................. 365/154, 365/185.23, 230.06
See application file for complete search history.

(56) References Cited

U.S. PATENT DOCUMENTS

| | | | |
|---|---|---|---|
| 6,442,060 B1 | 8/2002 | Leung | |
| 6,573,549 B1 * | 6/2003 | Deng et al. | 257/296 |
| 6,977,837 B2 * | 12/2005 | Watanabe et al. | 365/156 |
| 7,079,413 B2 | 7/2006 | Tsukamoto et al. | |
| 7,177,177 B2 * | 2/2007 | Chuang et al. | 365/154 |
| 2005/0255656 A1 * | 11/2005 | Kang et al. | 438/283 |
| 2006/0274569 A1 | 12/2006 | Joshi et al. | |

OTHER PUBLICATIONS

Guo et al., "FinFET-Based SRAM Design," Department of Electrical Engineering and Computer Sciences, University of California, Berkeley California, pp. 2-7.
Yamaoka et al., "Low Power SRAM Menu for SOC Application Using Yin-Yang-Feedback Memory Cell Technology," 2004 IEEE, 2004 Symposium On VLSI Circuits digest of Technical Papers, Tokyo Japan, pp. 288-291, 2004.
Actions on the Merits by the U.S.P.T.O. as of Nov. 29, 2007, 1 page.
International Search Report for correlating PCT Application No. PCT/US07/62196 dated Apr. 1, 2008.
Actions on the Merits by the U.S.P.T.O. as of Apr. 8, 2008, 1 page.

* cited by examiner

*Primary Examiner*—Huan Hoang
*Assistant Examiner*—Jason Lappas

(57) ABSTRACT

A device is disclosed having a first Field Effect Transistor having a channel region controlled by a gate, a second Field Effect Transistor having a first channel region substantially controlled by a first gate, and a second channel region substantially controlled by a second gate. The gate of the first Field Effect Transistor and the first gate of the second Field Effect Transistor are coupled to a memory write line. The second gate of the second Field Effect Transistor receives a control signal from a memory bit cell.

20 Claims, 5 Drawing Sheets

SWITCH DEVICE AND METHOD

CROSS REFERENCE TO RELATED APPLICATIONS

The present application is related to U.S. patent application Ser. No. 11/373,584 (Client Reference No.: SC14542TP) entitled "SYSTEM AND METHOD FOR OPERATING A MEMORY CIRCUIT" filed Mar. 10, 2006, and having at least one inventor in common.

FIELD OF THE DISCLOSURE

This disclosure relates generally to an electronic switch and more specifically to an electronic switch that can be utilized as a pass gate for a memory cell.

BACKGROUND

In an effort to reduce the size of mobile electronic devices and increase the battery life of such devices, an emphasis has been placed on implementing low voltage circuit designs. However, designers of low voltage, nano-scale circuits face many challenges. One such challenge includes the design of reliable low voltage memory circuits. In particular, static random access memory (SRAM) cells can suffer performance degradation at low supply voltages. A typical SRAM memory can have millions of bit cells wherein each bit cell stores one bit of data. At low supply voltages, conventional memory systems cannot always reliably read, write, and retain data.

Operation of a SRAM is influenced by many factors. Specifically, when integrated circuits are manufactured, small variations in doping, layer thicknesses, and other procedures manifest as imprecise threshold voltages, leakage currents, and junction mismatches. These variations can effect operation of a SRAM. The ability of a memory to read and write data is measured in terms of static noise margin (SNM), write margin (WM), and cell current (Icell). The SNM of a SRAM memory cell is generally defined as the minimum noise voltage that, when present at a bit cell storage node, will make a bit cell flip to a wrong state. A bit cell is most vulnerable to noise during a read phase, during which, if a cell changes state a destructive read is said to occur. Cell current is the amount of current the memory cell can source or sink during a read phase. Wherein, write margin can be defined as a minimum voltage required on a bit line to pull a storage node low and flip the state of the bit cell from a high state to a low state during a write phase. A low write margin can lead to unsuccessful writes because it indicates that it is difficult to get data lines to drop to near zero volts. It is well known that design changes that improve one characteristic nearly always degrade at least one of the other characteristics, often to unacceptable levels. Accordingly, there is a need for a SRAM memory cell configuration that can overcome these problems.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items.

DETAILED DESCRIPTION

A typical memory cell has a bit cell that is connected to bit lines or data lines via pass gates. The bit lines can carry signals to and from the bit cell via pass gates in response to read and write control signals that control the pass gates. Historically, field effect transistors (FETs) have been utilized to implement pass gates. However, FETs have significant static power dissipation due to large leakage currents. These large leakage currents can travel through a pass gate to the bit cell, and if a leakage current is too large, the bit cell will flip, thereby changing the value stored by the cell and causing failure.

In accordance with a particular embodiment of the present disclosure, a hybrid switch can be utilized as a pass gate to provide improved isolation between a bit cell and a bit line during an off state, when leakage can affect the stored value, and provide improved signal transfer characteristics between the bit line and the bit cell during an "on" state. In accordance with one embodiment, the hybrid switch can be manufactured on a substrate of an integrated circuit by forming two transistors that are connected substantially in parallel. For a specific embodiment, the transistors have bodies that are perpendicular to the substrate. These perpendicular bodies are often referred to as fins (fin structures). One of the fins has a channel region characterized by first and second channel regions at opposing surface regions of the fin. The first and second channel regions are straddled by an "inverted U" shaped conductive gate, or a multisided gate. Another one of the fins can be "sandwiched" between two separate gates, forming a multi-gate semiconductor, wherein a first channel region of the fin is substantially controlled by a first gate, and a second channel region is substantially controlled by a second gate. Thus, four planar channel regions can be formed perpendicular to the substrate.

Figure 6:
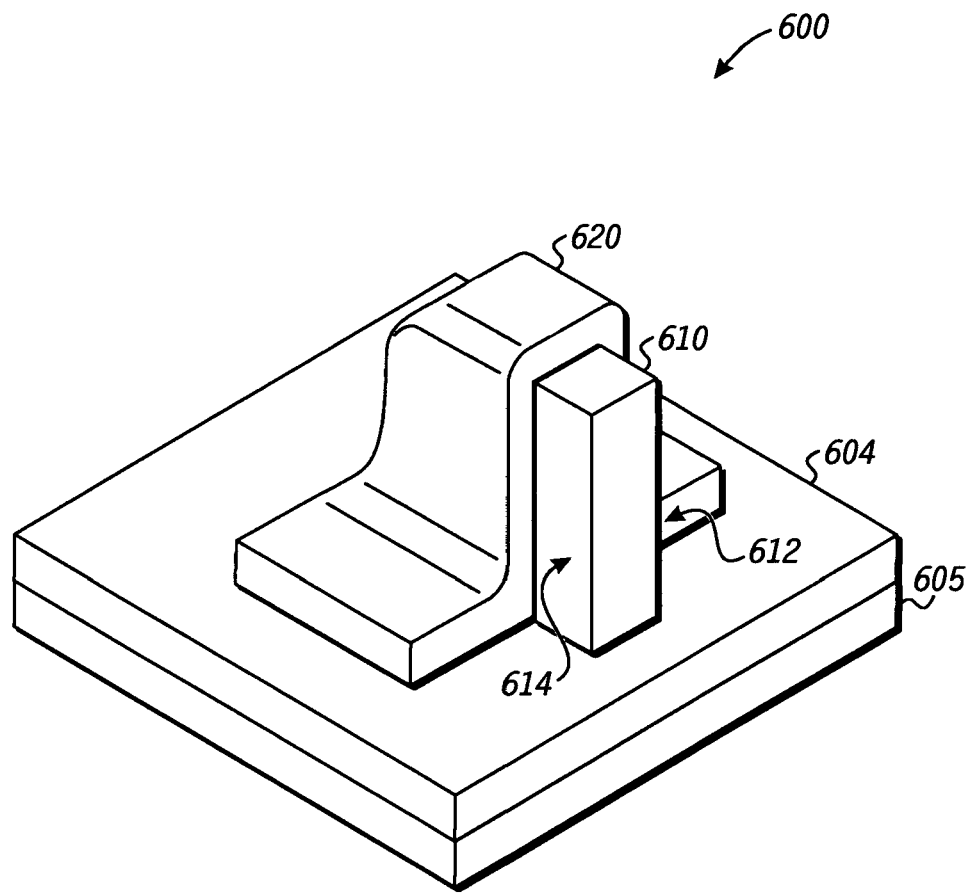
FIG. 6 is a diagram illustrating a 3-dimensional rendition of a FinFET transistor in accordance with a specific embodiment.

In a particular embodiment, the first fin is part of a field effect transistor referred to as a FinFET, having a single gate (see FIG. 6). A second fin is part of a FinFET having multiple independent gates and is referred to as a MigFET (see FIG. 7). The MigFET and the FinFET can be connected generally in parallel wherein three of the four planar channel regions are controlled by gates receiving a common control signal, and therefore create a cumulative channel region, leaving one channel region substantially controlled by a separate gate of the MigFET. The gates controlling the cumulative channel region can receive a read/write control signal that turns the hybrid switch/pass gate on during read and write phases, while the second gate substantially controls the second channel region on the MigFET independent of the read/write control signal.

Figure 1:
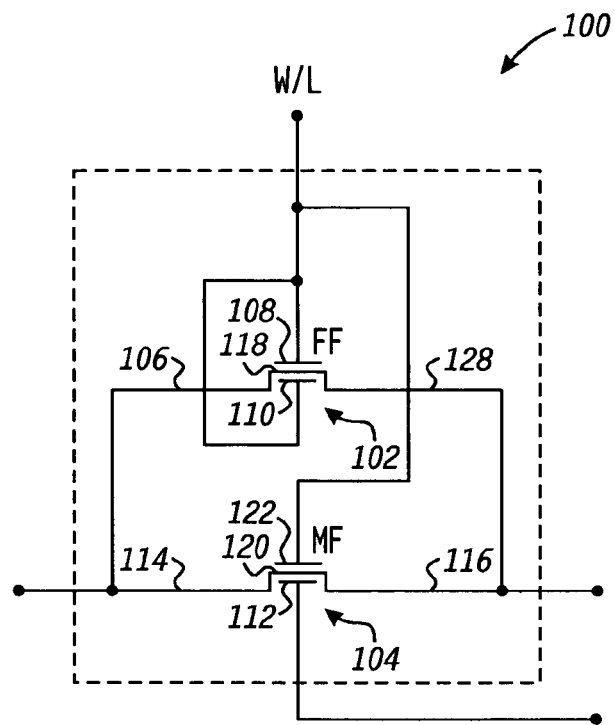
FIG. 1 is a block diagram of a switching device in accordance with a specific embodiment of the present disclosure.

Referring to FIG. 1, a hybrid switch 100, also referred to as a pass gate, is depicted. The hybrid switch 100 can be created by connecting a gate that controls the opposing channel regions of FinFET 102 in parallel with a gate that controls only one of two opposing channel regions of MigFET 104, while reserving a second gate 112 of the MigFET 104 for a secondary signal, such as a bias signal, to control the other opposing channel region of MigFET 104. The fin structure where the channel region resides can be straddled by a continuous conductive gate represented by elements 108 and 110. The continuous gate surface can be formed in an "inverted U" shape that has two parallel planar surfaces wherein the parallel surfaces are perpendicular to the integrated circuit substrate (see FIG. 6). Although in one embodiment the gate of the FinFET is a continuous media that straddles the fin, in another embodiment a MigFET (see FIG. 7) could be configured as a FinFET wherein the independent gate surfaces can be connected via a conductor. The FinFET 102 can also have source/drain electrodes 106 and 128.

Similarly, MigFET 104 can have a fin structure 120. However, the gate surfaces of the MigFET 104 are such that two or more parallel, i.e., multiple, independent gates, namely gate 122 and gate 112, are formed. These independent gates can be planar surfaces that are parallel to each other and perpendicular to the substrate of the integrated circuit (see FIG. 7). The MigFET 104 can also have source/drain electrodes 114 and 116.

FinFET gate portions 108 and 110 can be connected to MigFET gate 122. FinFET source/drain 128 can be connected to MigFET source/drain 116. Additionally, FinFET source/drain 106 can be connected to MigFET source/drain 114 and a fourth gate 112, referred to as the independent gate, of MigFET 104 can be connected to a device, circuit or node that provides a signal that can bias the MigFET 104.

It will be appreciated that the hybrid switch 100 can be utilized as a pass gate for a memory circuit. However, this single application should not be considered limiting, as the hybrid switch 100 can be utilized in many other applications. Specifically, any application that can benefit from varying the impedance, currents and voltage drops of a switch can effectively utilize hybrid switch 100. In one embodiment, the hybrid switch 100 can be utilized as a pass gate in a SRAM memory cell. In such a configuration, FinFET source/drain electrode 128 and MigFET source/drain electrode 116 can be connected to a bit line and the FinFET source/drain 106 and the MigFET source/drain 114 can be connected to a bit cell. Note that NMOS or PMOS transistors may be utilized to fabricate the hybrid switch 100. The actual interconnection of the hybrid switch to a bit cell may also depend upon the type of memory cell configuration utilized (i.e. a 4T or 6T SRAM cell).

A dual finned hybrid switch of the type described with respect to FIG. 1 can provide an increased effective channel width over traditional planar MOSFET devices and even over a single finned pass gate configuration. With such a large gate area, the channels of the MigFET and FinFET can be fully depleted in response to a read/write signal. When a channel region is fully depleted during a read and a write phase, the pass gate can operate as a low impedance switch. The dual finned architecture can also suppress short channel effects as compared to traditional MOSFET designs. The independent gate of the MigFET can accept a control signal and change the operating point and operational parameters of the switch. It can be appreciated that in a memory cell, and in other circuits, different switch parameters are desirable depending on different circumstances. For example, depending on the logic value stored by the bit cell and the operating voltage, certain pass gate characteristics can provide improved performance. Thus, a control signal on the fourth gate/independent gate can fine-tune the pass gate during operation to improve overall system performance.

Figure 2:
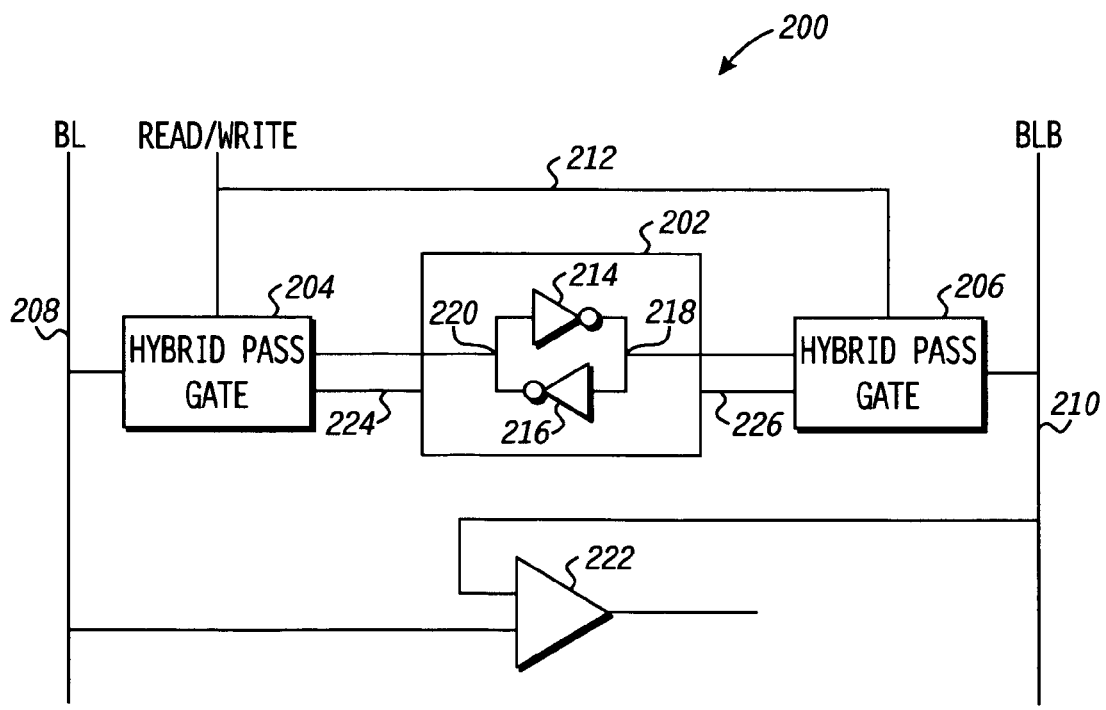
FIG. 2 is a block diagram that illustrates a specific application for the switching device of FIG. 1, namely as a hybrid pass gate for a memory cell.

Referring to FIG. 2, a block diagram 200 is provided that illustrates an exemplary usage of the hybrid switch 100 described above with reference to FIG. 1. Hybrid pass gates 204 and 206 are hybrid switches as previously described. Hybrid pass gate (HPG) 204 is connected between bit line (BL) 208 and bit cell 202, and HPG 206 is connected between bit line bar (BLB) 210 and bit cell 202.

In accordance with a particular embodiment, during a write phase when a logic signal is to be transferred from BL 208 or BLB 210 to bit cell 202, or during a read phase when a logic signal is to be detected at the bit cell 202 and provided to BL 208 or BLB 210 for other circuits, a control signal is provided over the read/write control line 212 to activate HPGs 204 and 206.

The HPG 204 and the HPG 206 can act as a switch to facilitate current flow between the bit cell 202 and BL 208, and bit cell 202 and BLB 210 when turned on. During the read phase, a sense circuit 222 can be communicatively connected to the BL 208 and BLB 210 to read a value from one or both of the storage nodes 220 and 218 of the bit cell 202. In accordance with a particular embodiment, the bit cell 202 can provide feedback to HPG 204 and HPG 206 via feedback lines 224 and 226 respectively. The feedback can alter the operational characteristics of HPG 204 and 206 to improve system performance during a read phase. More specifically, the feedback can partially bias at least one transistor in HPGs 204 and 206 to increase the write margin, reduce the chances of a destructive read, or provide other benefits depending on the implementation.

In one embodiment, the bit cell 202 can be configured with a first inverter 214 having its output connected to the input of a second inverter 216 and its input connected to an output of the second inverter, wherein a signal on an input of one of the inverters can flip the state of both inverters. When a signal on storage node 218 is at a logic high, storage node 220 is at a logic low such that a differential signal can be provided to a sense circuit 222 during a read phase. The bit cell 202 could also provide a differential signal to other types of "downstream" circuits during the read phase. In other embodiments a downstream circuit could accept a single bit line input from one side of the bit cell 202 to facilitate the read phase or read operation without parting from the scope of the present disclosure.

During a write phase, HPG 204 and HPG 206 can be turned on by asserting a control signal on read/write line 212, wherein a logic signal representing data on BL 208 or BLB 210 can be written or transferred via HPG 204 and HPG 206 to one of storage nodes 220 or 218. In one embodiment a stored differential signal can be provided to the bit cell 202 via BL 208 and BLB 210 during a write phase.

However, when low voltage pass gates are configured with a single FET, it is difficult for low voltage bit line driver circuits (now shown) to provide a low enough voltage on the bit line 208 to overwrite a high logic value stored, (Vdd), to a low logic value and to change the logic value stored by the bit cell 202. Hence, traditional pass gate configurations have poor write margins at low supply voltages. A low write margin occurs generally because at low supply voltages, the voltage drop across the traditional pass gate is a large percentage of the voltage to be transferred to the bit cell 202 from the bit line 208. As stated above, generally the combination of the bit line pull down circuits not being able to effectively provide zero volts on a bit line and a pass gate having a voltage drop can accumulate making it difficult to pull the storage node 220 of the bit cell 202 low enough to change the state of the bit cell.

In the illustrated embodiment, the feedback line 224 from the bit cell 202 can control a fractional amount of the gate surfaces in the HPG 204 to lower the impedance and thereby the voltage drop of the HPG 204 to improve the write margin and the cell current of the memory cell 202. Additionally, static cell stability can be improved during a standby phase by providing bit cell feedback to a fractional amount of the gate surfaces within the HPG 204 to increase the impedance of the pass gate depending on a state of the bit cell. The voltage stored by the bit cell 202 can provide feedback by biasing a transistor in the HPG 204 such that a reduced leakage current is provided via the HPG 204 when the bit cell stores a low voltage and an increased leakage current is provided via the HPG 204 to the bit cell 202 when the stored value is high. This is useful when the bit line 209 is held high as a default, e.g., except during a write phase where a low voltage value is being written. Providing a decreased leakage current when the stored value is low will prevent a low voltage at the storage node from rising, and increasing the leakage current when a stored signal is high provides a "refreshing" current to assist in sustaining the stored logic high value. Although the improved features discussed above were with respect to HPG 204, these features can also be used with respect to HPG 206.

Reduced operating impedance of a pass gate provides a more efficient transfer of signals to and from a bit cell during the read and write phase. The hybrid switch configuration taught herein can be tailored to provide desired operational parameters for many different implementations based on different operational requirements. For example, a hybrid switch can be customized by adjusting the size and dimensions of the gate surfaces and the channel and by changing the modifying the doping to optimize switch performance based on the implementation.

Figure 3:
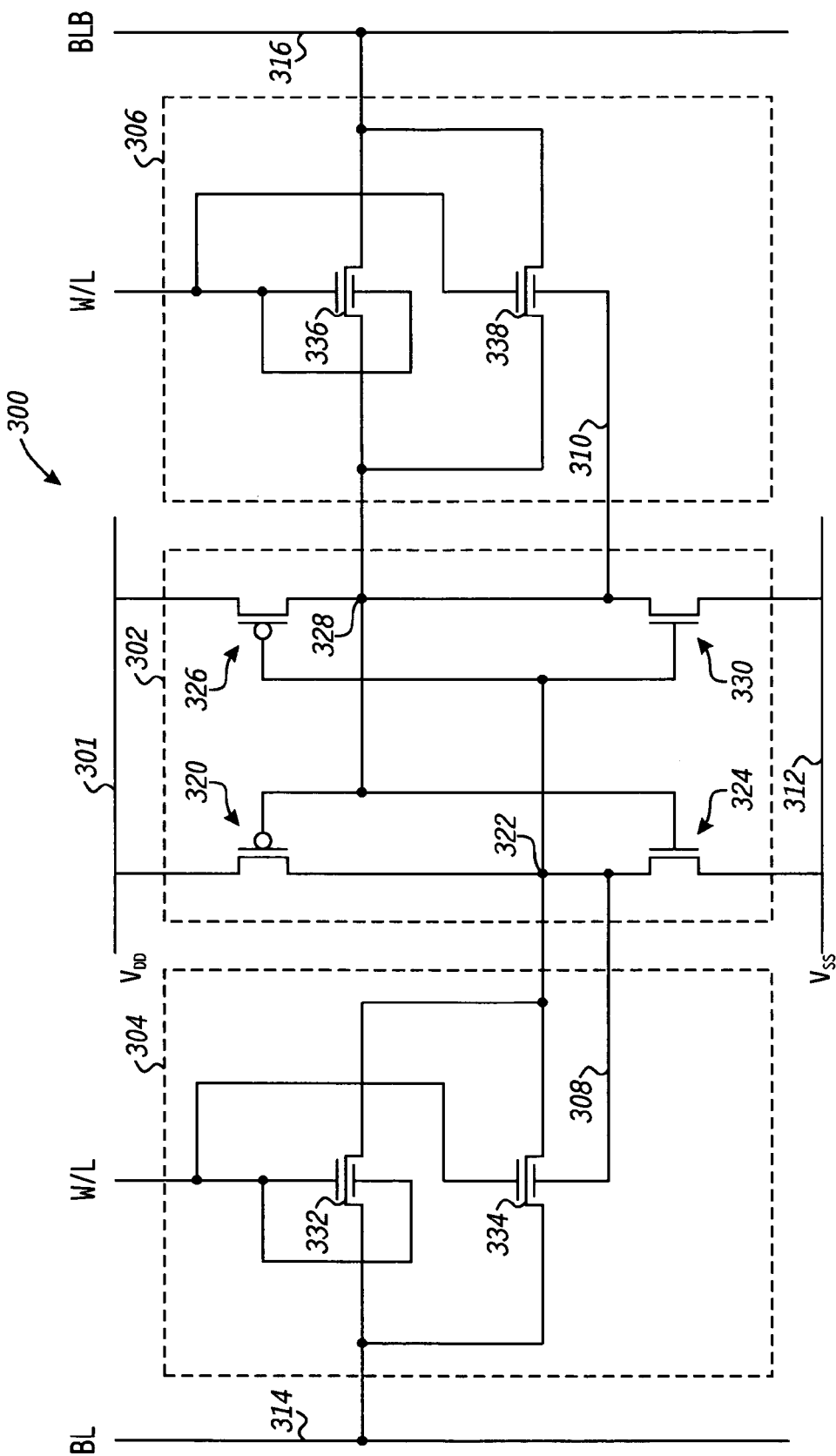
FIG. 3 is a block diagram of an exemplary 6T memory cell configuration having hybrid pass gates that provides read/write access to a bit cell.

Referring to FIG. 3, a specific embodiment of memory cell configuration that is often referred to as a 6T configuration (because the traditional cell configuration utilizes 6 transistors) is illustrated. Although the circuit illustrated has 8 transistors, it will be referred to herein as a 6T configuration because the hybrid switch can be viewed as a single device and the generic operational principals associated with a traditional 6T configuration generally apply. Furthermore, even though FinFETs are specifically illustrated, planar transistors are also anticipated.

The memory cell configuration 300 is divided into functional blocks (separated by dashed lines) that include hybrid pass gate (HPG) 304 and HPG 306 connected to a bit cell 302. HPG 304, HPG 306 and bit cell 302 are functionally similar to elements 204, 206 and 202 of FIG. 2 respectively. HPG 304 can be connected to bit line (BL) 314, while HPG 306 can be connected to bit line bar (BLB) 316 such that logic signals or logic states can be transferred to and from the bit cell 302 responsive to a read or a write signal. Power bus 301 and ground bus 312 can provide power to the bit cell 302.

HPG 304 can be configured with a FinFET 332 connected essentially in parallel, as shown with a MigFET 334 as described in FIG. 1, with a gate of the MigFET 334 connected to storage node 322 via feedback line 308. Likewise, HPG 306 can be configured with a FinFET 336 connected in parallel with a MigFET 338 wherein a gate of the MigFET 338 is connected to storage node 328 via feedback line 310. Placing a control signal such as a read/write control signal on a larger cumulative gate surface (essentially three semiconductor gate surfaces) in the HPGs 304 and 306 provides lower impedances for signal currents moving to and from the bit cell 302.

Connecting a gate electrode of the MigFET (334 or 338) to a storage node, such as one of the storage nodes 322 or 328 of the bit cell 302, creates a feedback loop because a signal stored at one of storage nodes acts to control operation of the MIGFET thereby improving memory cell performance. In the embodiment illustrated, the feedback provided will change according to the level of the voltage stored by the storage nodes 322 and 328. The different voltages will change the bias point of HPGs 304 and 306 and improve the static noise margin of the system.

Bit cell 302 contains pull-down transistors 324 and 330 and pull-up transistors 320 and 326. In one embodiment, pull-down transistors 324 and 330 could be implemented as FinFETs or MigFETs with two fins to provide an improved SNM while pull-up transistors 320 and 326 could also be FinFETs with single fins. Alternatively, transistors 320, 324, 326 and 330 can be planar MOSFETs, or other types of transistors.

In operation, the memory cell configuration 300 can operate in three distinct modes or phases: a read phase, a write phase, and a stand-by phase. During a write phase, the logic value at a storage node, such as storage node 322, can be changed from one state to another based upon a value at BL 314. During a write operation that transitions node 322 from a high state to a low state, HPG 304 and pull-up transistor 320 form a resistive voltage divider wherein the voltage at the storage node 322 is a fraction of the voltage between the supply voltage and the bit line 314. Thus, when a low voltage value is at BL 314, the voltage at storage node 322 is based upon a division of the voltage between power bus 301 and the signal on bit line 314.

When the voltage divider pulls the voltage at the storage node 322 below the threshold voltage of the inverter formed by pull-up transistor 326 and pull-down transistor 330, a successful write operation will occur. A low voltage drop provided by the HPG 304, i.e., a low impedance across HPG 304 relative transistor 320, will increase the write margin which is the maximum allowable voltage level on bit line 314 that is low enough to reliably flip the state of the bit cell 302.

Likewise, to transition storage node 328 from a high voltage state to a low voltage state, a low-going signal on BLB 316 is applied, wherein pull-up transistor 326 and HPG 306 function as a voltage divider and determine what fraction is applied to storage node 328. The HPGs disclosed have a sufficient gate surface to provide a hard turn on of the FETs, thus providing a lower resistance to the memory cell 304 and advantageously changing the ratio of the voltage divider, placing a higher percentage of the BLB voltage on the storage node 328. Such lower resistances increase the write margin of the memory cell configuration 300.

In one embodiment, utilizing a HPG for a pass gate in a 6T cell configuration improves the Vmin write margin by approximately 150 mV relative to a pass gate that only utilizes a single MigFET. The specific implementation of the bit cell will determine how the feedback connections are made, and thus different feedback connection from those illustrated herein would not part from the scope of the present disclosure. The configuration illustrated utilizes CMOS devices and provides feedback to a HPG 304 by connecting storage node 332 to a gate of MigFET 334 and feedback to a HPG 306 by connecting storage node 328 to a gate of MigFET 338.

During the read phase, HPGs 304 and 306 can be turned on and BL 314 and BLB 316 can be driven by signals on storage nodes 322 and 328 respectively. Assuming an asserted level (high value) at storage node 322 and a negated level (low value) at storage node 328 when HPG 306 is turned on, a voltage or current will appear on BLB 316 that is determined by the voltage divider set up by HPG 306 and pull-down transistor 330. The voltage division between the voltage on the BLB 316 and ground potential is determined by the ratio of the equivalent series resistance of the HPG 306 and pull-down transistor 330.

The voltage divider created HPG 306 and pull-down transistor 330 can be determined using the ratio of the width to length of the body of the pull-down transistor 330 to the equivalent width and length ratio of the body of the HPG 306. Thus, the physical implementation of the devices can determine the ratio of the voltage divider and consequently how high the voltage on storage node 328 will rise during a read operation, wherein too much of a rise will cause cell failure.

It can be appreciated that the value at the storage node is vulnerable during a read phase, particularly when storage node 328 stores a low value and needs to drive a bit line pre-charged to a high value low. As such, it is beneficial to restrict the rise of the voltage at the storage node 328 during the read phase such that the voltage does not rise to a level that will flip the state of the cell. If a voltage, possibly caused by device variations or noise, occurs on storage node 328 that exceeds the trip point of the inverter formed by transistor 320 and 324, the cell will flip, changing the stored value during the read process. This phenomenon typically occurs during a read phase and is often called a destructive read.

The HPG 306 provides improved read stability because it utilizes the low value at the storage node 328 as feedback to increase the impedance of HPG 306 when a low value is being read by partially turning off the MigFET 338 via feedback line 310. This weakening of HPG 306 makes it more resistive, allowing storage node 328 to be better isolated from the bit line 316, thus keeping the storage node at a lower voltage during the read phase to improve the read SNM of the memory cell.

In the illustrative embodiment, an improved SNM can be achieved even when the voltage required to flip the state of the bit cell is reduced. The gain and transfer characteristics of the inverter formed by transistors 320 and 324 can be decreased by an appropriate manufacturing process. Additionally, specific configurations have a decrease in gain and transfer characteristics as the supply voltage is decreased. The hybrid switches in the HPGs allow the cell to still achieve an acceptable SNM during a read cycle at very low supply voltages such as 900 mV. The illustrated memory cell 300 provides an improved SNM when compared to conventional memory cell designs, even when the supply voltage is lowered over 100 mV, while also providing improvements in cell current of about 7% due to the lower impedances. Further, the use of the HPGs with the feedback connections 308 and 310 provides approximately a 50% improvement in cell current as compared to a SRAM cell with a single MigFET pass gate configured to receive a feedback signal.

Figure 4:
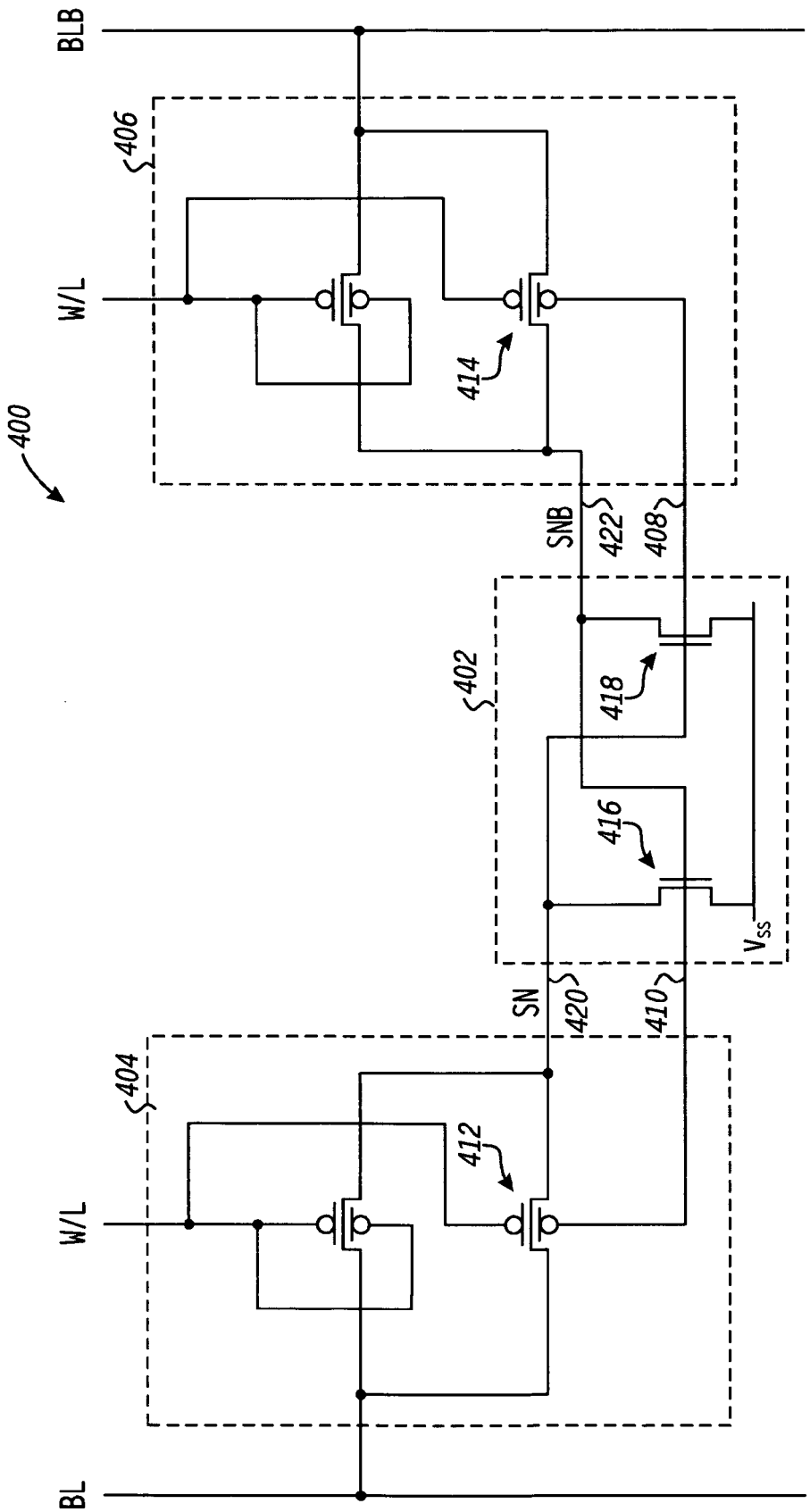
FIG. 4 is a block diagram of an exemplary 4T cell configuration having hybrid pass gates in accordance with another embodiment of the present disclosure.

Referring to FIG. 4, a specific embodiment of a memory cell configuration that is often referred to as a 4T configuration (because the traditional cell configuration utilizes 4 transistors) is illustrated. Although the circuit illustrated has 6 transistors it will be referred to as a 4T configuration because hybrid pass gates 404 and 406 can be considered as a single device and the generic operating principals for traditional 4T will still apply. The memory cell configuration 400 is divided into functional blocks (separated by dashed lines) that include hybrid pass gate HPG 404, a HPG 406, and a bit cell 402. These elements are functionally similar to elements 204, 206, and 202 of FIG. 2, respectively. HPGs 404 and 406 can be configured with MigFET transistors 412 and 414 respectively to provide improved memory cell performance.

Similar to the configuration described in FIG. 3, during transition the HPGs 404 and 406 of FIG. 4 and the transistors 416 and 418 form voltage divider networks. Thus, the lower effective series resistance and the feedback controlled leakage of HPGs 404 and 406 can provide improved performance for a 4T memory cell configuration similar to the embodiments described above. Storage nodes 422 and 420 provide feedback via feedback lines 410 and 408 to the independent gates of the MigFETs 412 and 414. The voltage levels at the storage nodes 422 and 420 can improve pass gate and correspondingly memory cell performance during the read, write, and standby phases of operation.

During a write operation, to transition storage node 420 from a high voltage logic state to a low voltage logic state, a low voltage logic level can be provided via the HPG 404 and its bit line to the gate of pull-down transistor 418, thereby turning off pull-down transistor 418 and allowing storage node 422 (SNB) to rise to a high voltage logic level at BLB through HPG 406. The transition of storage node 420 from high to low is facilitated because MigFET 412 is turned on hard at the beginning of the write cycle as feed back to MigFET 412 is provided from storage node bar 422 is at a low value during this time.

During a read operation, if storage node 420 is at a high voltage logic state and storage node bar 422 is at a low voltage logic state, transistor 416 is turned off and transistor 418 is on and receives a leakage current provided by partially biased MigFET 414 (responsive to the feedback). When the HPGs are turned on during the read phase, a higher resistance is provided by HPG 406 because MigFET 414 is partially turned off and therefore provides increased impedance between BLB and the bit cell 402 to preserve the low voltage logic state of storage node bar 422. This can keep storage node bar 422 at a lower voltage level, reducing the chance of a destructive read at low supply voltages.

During a standby phase or when a read or a write is not in process, it is beneficial for the memory cell configuration 400 to retain or hold the last written value and minimize power consumption. As stated above, during a stand-by phase feedback line 408 and feedback line 410 can be utilized by MigFET 414 and MigFET 412 to improve the static noise margin and increase cell stability. Hold stability is commonly qualified by a cell static noise margin (SNM) in standby mode. The SNM of a cell represents the minimum DC voltage disturbance on a storage node that will flip the state of the cell. This disturbance can occur as noise on the power line or noise from adjacent circuits. Large arrays of SRAM cells typically have large variations in SNM and, in one embodiment for all cells to properly function, the SNM of all cells should be greater than 0V.

During a standby or retention mode, when storage node 420 is asserted or stores a high voltage logic value and storage node bar 422 is negated or stores a low voltage logic value, the feedback of node 422 will partially turn on MigFET 412 to provide an increased "leakage current" to the storage node 420, thereby assisting the storage node 420 in maintaining the asserted state. This leakage current can be provided to the cell when the bit line is at an asserted value. The feedback from storage node 420 to MigFET 414 will turn off the MigFET 414 harder and reduce the leakage current such that the leakage current will not be enough to raise the voltage at the storage node bar 422 and flip the state of the cell. The feedback connections 408 and 410 also provide additional noise immunity to enhance memory cell stability. Thus, isolation and a controlled leakage current from the hybrid pass gates disclosed herein can provide an improved SNM for a memory cell.

A 4T cell configuration with PMOS pass gate devices is illustrated in FIG. 4. In an alternate configuration NMOS pass gate devices could be utilized. If NMOS devices are utilized the independent feedback gates of MigFET 412 and 414 can be connected differently. For example, feed back line 408 could connect a gate of MigFET 414 to storage node bar 422 and feedback line 410 could connect a gate of MigFET 412 to storage node 420. Further, any combination of NMOS and PMOS devices would not part from the scope of the present disclosure.

A 4T memory cell configuration requires less chip area than a 6T configuration. However, 4T configurations have reduced performance metrics. Namely, a typical 4T memory cell configuration has stability issues and requires higher leakage currents to ensure cell stability. Thus, the static power dissipation of a 4T memory cell is considerably higher than other configurations such as a 6T cell configuration.

Hybrid switches such as those illustrated as part of HPG 404 and HPG 406 can provide additional improved performance metrics for 4T cell configurations. One such metric includes a significant improvement in cell current. A hybrid switch that is manufactured utilizing 65 nm technologies can improve cell current as much as 70% when compared to a single MigFET pass gate configuration. Additionally, the 4T configuration illustrated can be manufactured utilizing the same area as a 6T planar cell. Further, the 6T hybrid switch configuration can be manufactured in an area that is only 30% larger than a 4T FinFET cell that utilizes a single MigFET for a pass gate. A single MigFET utilized as a pass gate provides good SNM but the cell current for a single MigFET is 50% lower then conventional bulk MOSFET designs, thus limiting system performance in some cases.

Figure 5:
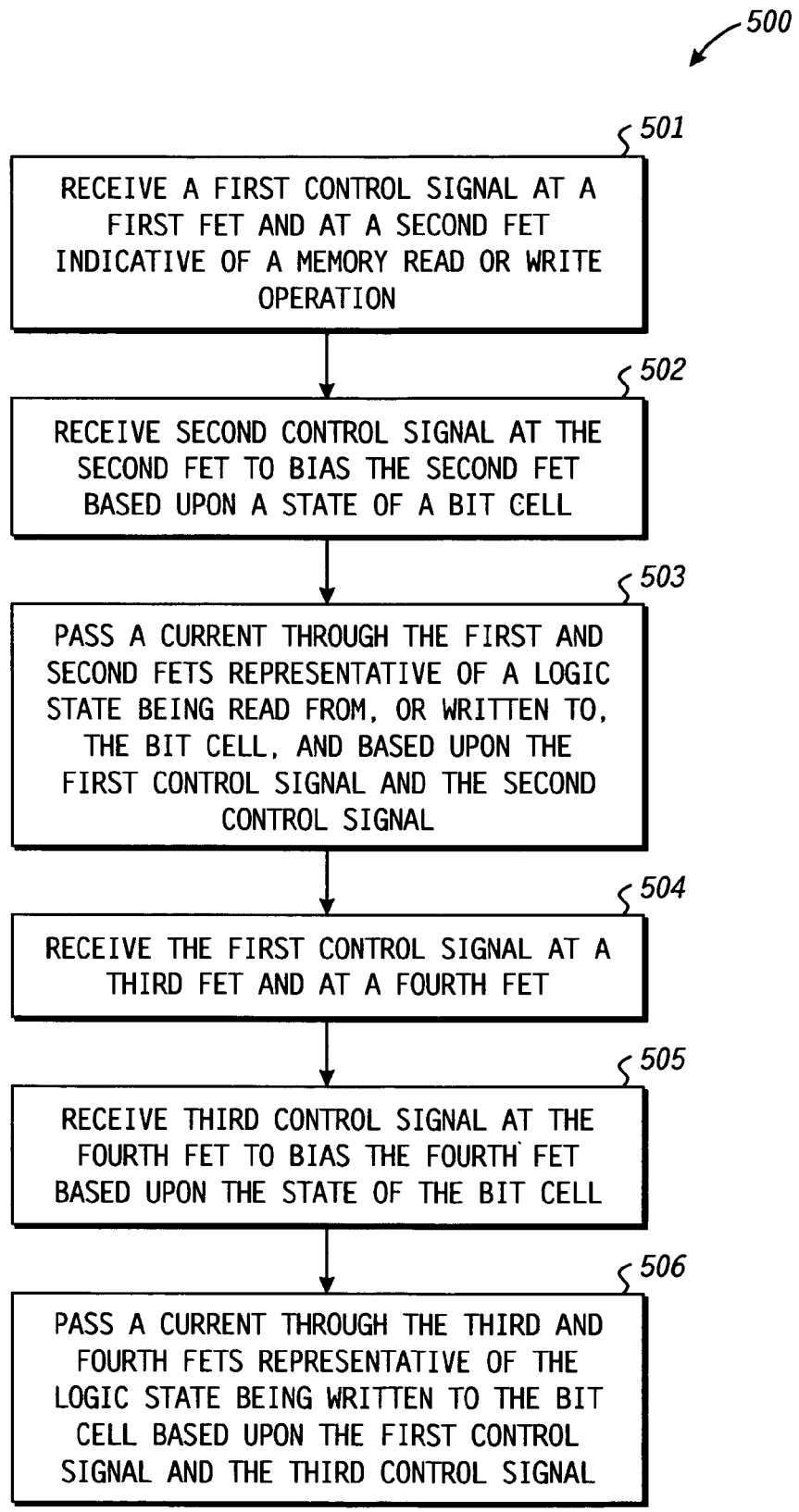
FIG. 5 is a flow diagram of an exemplary method for operating a memory cell in accordance with a specific embodiment of the present disclosure.

FIG. 5 is a flow diagram of a method for improving the read and write parameters of a memory cell in accordance with the specific embodiment of the present disclosure. At block 501, a first control signal is received at a first field effect transistor and at a second field effect transistor, wherein the first control signal is indicative of a memory read or a memory write operation. In one embodiment, the first and second transistors are FinFETs.

At block 502, a second control signal is received at the second FET to bias the second FET based upon a state of a bit cell to which information is being written, or from which information is being read. In one embodiment, the second FET includes a first and a second control gate, one for receiving the first control signal, the other for receiving the second control signal. In one embodiment, the total channel width is substantially the same for the both FETs, however, while the entire channel width of the first FET is controlled by the first control signal, only approximately one half of the totaled channel width of the second FET is controlled by the first control signal, and the other half of the channel width is controlled by the second control signal. With respect to the FinFETs, it would be appreciated that multi gate FinFETs, such as the type illustrated in FIG. 7, have a channel region on either side of a fin structure that are substantially controlled substantially independently of the other by one of the two control gates.

At block 503, a current is passed through the first and the second FinFETs that is representative of a logic state being read from, or written to, the bit cell. This current is further based upon the first control signal and the second control signal. Receiving control signals and passing the current through the first and the second FETs as described with reference to blocks 501-503 is advantageous over previous methods of accessing memory, in that it allows for an improved static noise margin and write margin.

Blocks 504-506 represent additional embodiments as would typically being associated with a bit cell having complementary storage nodes. At block 504, the first control signal is received at a third FET and a fourth FET. As previously described, the third FET and the fourth FET can comprise FinFETs.

At block 505, the third control signal is received at the fourth FET to bias the fourth FET based upon the state of a bit cell. In a specific embodiment, the fourth FET includes a first gate connected to receive the first control signal, and a second control gate connected to receive the third control signal. In one embodiment, the second control signal and the third control signal are complementary signals representative of the state information being stored by the bit cell.

At block 506, a current is passed to the third and fourth FETs that is representative of a logic state being written to, or read from, a bit cell, wherein the current passed to the third and fourth FETs is based upon the first control signal and the third control signal, in manner similar to that previously described.

FIG. 6 illustrates, in 3-dimensional perspective, a specific type of FinFET formed at a substrate that includes an insulative layer 604 and support layer 605 that can be used in accordance with the present disclosure. The transistor of FIG. 6 is a single gate FinFET, comprising a signal conductive gate 620 formed overlying a semiconductor fin structure 610. Note that a gate dielectric (not shown) is typically formed between conductive gate 610 and semiconductor fin structure 620. The semiconductor fin structure 610 comprises a first surface 612 and a second surface 614. Surfaces 612 and 614 are opposing surfaces, and represent planar surfaces at which channel regions are formed underlying conductive gate 620. It will be appreciated, that while a first channel region can be formed near surface 612 under conductive gate 620, and a second channel region can be formed near surface 614 under conductive gate 620, that in effect, based upon the thickness of the semiconductor fin structure 610, that a channel region can be formed through the entire thickness of fin structure 610 between surfaces 612 and 614 under conductive gate 620.

Figure 7:
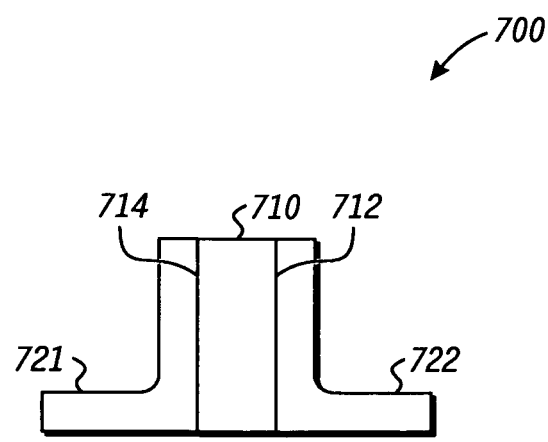
FIG. 7 is a diagram illustrating a cross-sectional view of a FinFET transistor having multiple gates in accordance with a specific embodiment.

FIG. 7 illustrates a cross-sectional view of a multi-gate FinFET 700. The multi-gate FinFET 700 differs from the single gate FinFET of 600 of FIG. 6 in that there are separate conductive control gates 721 and 722 that are used to control different channel regions of the semiconductor fin structure 710. It will be appreciated that a first channel region near the surface 712 of semiconductor fin structure 710, that underlies conductive gate structure 722, will be substantially controlled by conductive gate structure 722. Similarly, a second channel region near the surface 714 of semiconductor fin structure 710, that underlies gate structure 721, will be substantially controlled by the conductive gate 721. In this manner, a signal provided to one of the conductive gates, such as conductive gate 722, can act to bias the overall FinFET 700, such that the response of the FinFET 700 to a control signal at conductive gate 721 is affected. For example, assuming conductive gate 722 is biased by a high voltage level, the effect of a low to high transitioning signal on conductive gate 721 results in turning the FinFET 700 fully on more rapidly than if conductive gate 722 were biased by a low voltage level. When turned on, carriers in the channel regions flow in a direction substantially parallel to a primary surface of the substrate.

It will be appreciated that future circuits and future circuit configurations including memory cell configurations with similar design challenges or issues could be implemented in accordance with the teachings herein. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

The invention claimed is:

1. A device comprising:
 a bit cell comprising a first storage node;
 a write line;
 a first bit line;
 a first Field Effect Transistor (FET) comprising at least one gate coupled to the memory write line, a first source/drain coupled to the first bit line, and a second source/drain coupled to the first storage node to write a logic state at the first storage node; and
 a second FET comprising a first gate, a second gate coupled to receive a first control signal from the bit cell, a first channel region substantially controlled by the first gate, a second channel region substantially controlled by the second gate, a first source/drain coupled to the first bit line, and a second source/drain coupled to the second source/drain of the first FET, first FET and the second FET operable to communicate logic state information at the first bit line to the first storage node to write the logic state at bit cell.

2. The device of claim 1, wherein the first control signal is a feedback signal based upon a state of the bit cell.

3. The device of claim 1, wherein the second gate of the second FET is coupled to the first storage node of the bit cell to receive the first control signal.

4. The electronic device as in claim 3, wherein the first and second FETs are FinFETs.

5. The device of claim 1, further comprising:
 a third FET comprising at least one gate coupled to the memory write line; and
 a fourth FET comprising a first gate coupled to the memory write line, a second gate coupled to receive a second control signal from the bit cell, a first channel region substantially controlled by the first gate, a second channel region substantially controlled by the second gate, a first source drain coupled to a second bit line, and a second source/drain coupled to a second storage node of the bit cell, the third FET and the fourth FET operable to communicate logic state information at the second bit line to the second storage node.

6. The electronic device as in claim 5, wherein the bit cell further comprises a first pull-up transistor to pull up the first storage node, a first pull-down transistor to pull down the first storage node, a second pull-up transistor to pull up the second storage node, and a second pull-down transistor to pull down the second storage node.

7. The electronic device as in claim 6, wherein the first, second, third, and fourth FETs are FinFETs.

8. The electronic device as in claim 7, wherein the first and second pull-up transistors and the first and second pull-down transistors are FinFETs.

9. The electronic device as in claim 1, wherein the first and second FETs are FinFETs.

10. A method for controlling a memory cell comprising:
 receiving a first control signal at a first Field Effect Transistor (FET) comprising a source/drain and at a second FET comprising a source/drain connected to the source/drain of the first FET, wherein the control signal is indicative of a memory read or write operation;
 receiving a second control signal at the second FET to bias the second FET based upon a state of a first storage node of a bit cell; and
 the first FET and the second FET operable to communicate logic state information at a first bit line to the first storage node by passing a current through the first and second FETs indicative of the logic state being written to the first storage node of the bit cell, wherein the current is based upon the first control signal and the second control signal.

11. The method for controlling the memory cell of claim 10, wherein the state of the first storage node is representative of a data bit stored at the memory cell.

12. The method for controlling the memory cell of claim 10, further comprising:
 receiving the first control signal at a third FET and at a fourth FET;
 receiving a third control signal at the fourth FET to bias the fourth FET based upon a state of a second storage node of the bit cell; and
 the third FET and the fourth FET operable to communicate logic state information at a second bit line to the second storage node by passing a current through the third and fourth FETs indicative of the logic state being written to the second storage node of the bit cell based upon the first control signal and the third control signal.

13. The method for controlling the memory cell of claim 12, wherein the current through the third and fourth FET represents information complementary to information represented by the current through the first and second FET.

14. A method for controlling a memory cell comprising:
 receiving a first control signal at a first Field Effect Transistor (FET) and at a second FET, wherein the control signal is indicative of a memory read or write operation;
 receiving a second control signal at the second FET to bias the second FET based upon a state of a bit cell; and
 passing a current through the first and second FETs representative of a logic state being read from, or written to, the bit cell, wherein the current is based upon the first control signal and the second control signal;
 receiving the first control signal at a third FET and at a fourth FET;
 receiving a third control signal at the fourth FET to bias the fourth FET based upon the state of the bit cell; and
 passing a current through the third and fourth FETs representative of the logic state being read from, or written to the bit cell based upon the first control signal and the third control signal.

15. The device of claim 1, wherein the first source/drain of the second FET is connected to the first source/drain of the first FET.

16. The device of claim 1, wherein the second gate of the second FET is connected to the second source/drain of the second FET.

17. A device comprising:
 a bit cell comprising a first storage node;
 a write line;
 a first bit line;
 a first Field Effect Transistor (FET) comprising a channel region comprising at least one gate coupled to the memory write line, a first source/drain coupled to the first bit line, and a second source/drain coupled to the first storage node to write a logic state at the first storage node;
 a second FET comprising a first gate, a second gate coupled to receive a first control signal from the bit cell, a first channel region substantially controlled by the first gate, a second channel region substantially controlled by the second gate, a first source/drain coupled to the first bit line, and a second source/drain coupled to the first storage node to write a logic state at the first storage node;

a third FET comprising at least one gate coupled to the memory write line; and a fourth FET comprising a first gate coupled to the memory write line, a second gate coupled to receive a second control signal from the bit cell, a first channel region substantially controlled by the first gate, a second channel region substantially controlled by the second gate, a first source drain coupled to a second bit line, and a second source/drain coupled to a second storage node of the bit cell to write a logic state at the first storage node.

18. The electronic device as in claim 17, wherein the bit cell further comprises a first pull-up transistor to pull up the first storage node, a first pull-down transistor to pull down the first storage node, a second pull-up transistor to pull up the second storage node, and a second pull-down transistor to pull down the second storage node.

19. The electronic device as in claim 18, wherein the first, second, third, and fourth FETs are FinFETs.

20. The electronic device as in claim 19, wherein the first and second pull-up transistors and the first and second pull-down transistors are FinFETs.

* * * * *